United States Patent
Itabashi

(10) Patent No.: US 10,263,583 B2
(45) Date of Patent: Apr. 16, 2019

(54) VARIABLE GAIN AMPLIFIER

(71) Applicant: SUMITOMO ELECTRIC INDUSTRIES, LTD., Osaka (JP)

(72) Inventor: Naoki Itabashi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/860,870

(22) Filed: Jan. 3, 2018

(65) Prior Publication Data

US 2018/0198431 A1 Jul. 12, 2018

(30) Foreign Application Priority Data

Jan. 10, 2017 (JP) ................. 2017-001623

(51) Int. Cl.
| | |
|---|---|
| *H03G 3/20* | (2006.01) |
| *H03F 1/32* | (2006.01) |
| *H03F 3/45* | (2006.01) |
| *H03G 3/00* | (2006.01) |
| *H03F 3/60* | (2006.01) |
| *H03G 1/00* | (2006.01) |
| *H03F 3/55* | (2006.01) |
| *H03G 3/30* | (2006.01) |

(52) U.S. Cl.
CPC ............. *H03G 3/20* (2013.01); *H03F 1/3211* (2013.01); *H03F 3/4508* (2013.01); *H03F 3/45089* (2013.01); *H03F 3/45475* (2013.01); *H03F 3/45502* (2013.01); *H03F 3/55* (2013.01); *H03F 3/605* (2013.01); *H03G 1/0023* (2013.01); *H03G 1/0088* (2013.01); *H03G 3/001* (2013.01); *H03G 3/30* (2013.01); *H03F 2203/45392* (2013.01); *H03F 2203/45466* (2013.01)

(58) Field of Classification Search
CPC ................................. H03G 3/20; H03F 1/3211
See application file for complete search history.

(56) References Cited

U.S. PATENT DOCUMENTS

| | | | |
|---|---|---|---|
| 2005/0052239 A1* | 3/2005 | Bosch | H03G 1/0023 330/254 |
| 2006/0273857 A1* | 12/2006 | Chiricosta | H03G 1/0023 330/254 |
| 2007/0030070 A1* | 2/2007 | Brueske | H03F 3/189 330/260 |

(Continued)

FOREIGN PATENT DOCUMENTS

JP 2011-205470 10/2011

*Primary Examiner* — Patricia T Nguyen
(74) *Attorney, Agent, or Firm* — Smith, Gambrell & Russell, LLP.

(57) ABSTRACT

A variable gain amplifier capable of stabilizing an average output potential of a differential output signal, improving power efficiency over a wide range of an amplitude of the differential input signal, and suppressing deterioration of a distortion rate is provided. The variable gain amplifier includes an amplifying circuit configured to amplify a differential input signal with a gain according to a gain control signal, and a current control circuit. The amplifying circuit has a first current source supplying a source current. The current control circuit adjusts a magnitude of the source current of the first current source according to a magnitude of the gain control signal.

10 Claims, 6 Drawing Sheets

(56) References Cited

U.S. PATENT DOCUMENTS

| | | | |
|---|---|---|---|
| 2009/0153245 A1* | 6/2009 | Lee | H03F 1/3211 330/254 |
| 2010/0289583 A1* | 11/2010 | Touzard | H03F 3/19 330/254 |
| 2012/0018622 A1* | 1/2012 | Sugimoto | H03F 3/08 250/214 A |
| 2013/0114665 A1* | 5/2013 | Aziz | H04L 25/03057 375/233 |

* cited by examiner

VARIABLE GAIN AMPLIFIER

TECHNICAL FIELD

An aspect of the present invention relates to a variable gain amplifier.

BACKGROUND

A Gilbert Cell type variable gain amplifier (hereinafter referred to simply as a "differential amplifier") may be used as a circuit for driving an optical modulator in an optical transceiver or the like. The differential amplifier has a variable gain which can be varied in accordance with a gain control signal given to bases of four transistors provided in an upper stage (see, for example, Japanese Unexamined Patent Publication No. 2011-205470). Proper adjustment of the gain control signal with respect to a fluctuation factor such as temperature, for example, allows the optical modulator driven by an output signal of the differential amplifier to stably generate an optical output signal having a constant amplitude. However, when the gain is changed, an average potential (center potential) of the output signal undesirably moves to cause malfunction of the amplifier in the next stage or distortion of the output signal. Further, in a case in which a current source of the differential amplifier is set to provide a large source current enough to suppress distortion with respect to a maximum input amplitude, a smaller input amplitude decreases power efficiency of the differential amplifier.

SUMMARY

A variable gain amplifier according to an aspect of the present invention is a variable gain amplifier amplifying a differential input signal including a positive phase component and a negative phase component having phases opposite to each other with a gain according to a gain control signal, and outputting a differential output signal including a positive phase component and a negative phase component having phases opposite to each other, and includes an amplifying circuit and a current control circuit. The amplifying circuit includes a first current source having a first end and a second end and supplying a source current flowing from the first end to the second end; a first differential circuit being electrically connected to the first end of the first current source and splitting the source current into a first current and a second current according to the differential input signal; a second differential circuit being electrically connected to the first differential circuit and splitting the first current into a third current and a fourth current according to a magnitude of the gain control signal; a third differential circuit being electrically connected to the first differential circuit, and splitting the second current into a fifth current and a sixth current according to the magnitude of the gain control signal so that a ratio of the fifth current to the sixth current is equal to a ratio of the fourth current to the third current; a first resistor being electrically connected to the second differential circuit and generating the negative phase component of the differential output signal according to a magnitude of a voltage drop occurring due to a flow of the fourth current; and a second resistor being electrically connected to the third differential circuit and generating the positive phase component of the differential output signal according to a magnitude of a voltage drop occurring due to a flow of the fifth current. The current control circuit controls the first current source, decreases the source current when the gain control signal increases the gain, and increases the source current when the gain control signal decreases the gain.

DETAILED DESCRIPTION

Figure 1:
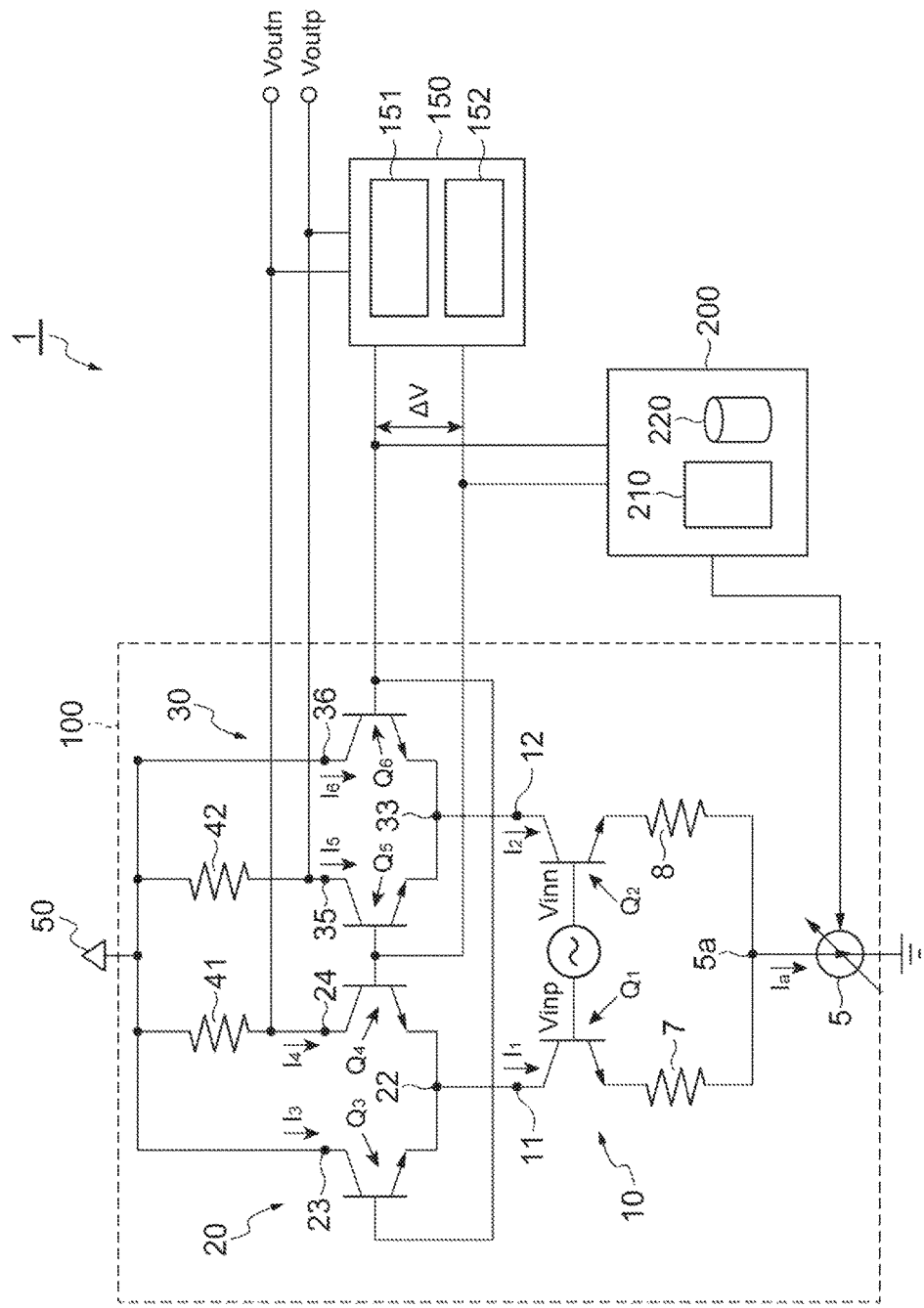
FIG. 1 is a diagram illustrating a schematic configuration of a variable gain amplifier according to an embodiment of the present invention.

Hereinafter, embodiments of a variable gain amplifier according to the present invention will be described in detail with reference to the accompanying drawings. In the drawings, the same elements are denoted by the same reference numerals, and duplicate description will be omitted. The variable gain amplifier is used, for example, as a circuit for driving an optical modulator in an optical transceiver. In this specification, it is assumed that a transistor includes both a bipolar transistor and a field effect transistor (FET). In the following description, a case in which the transistor is the bipolar transistor having a base, an emitter, and a collector will be described by way of example. When the transistor is the FET, the base, emitter, and collector may be read as a gate, a source, and a drain, respectively.

FIG. 1 is a diagram illustrating a schematic configuration of the variable gain amplifier according to an embodiment of the present invention. The variable gain amplifier 1 amplifies a differential input signal Vinp, Vinn and outputs an amplified differential input signal as a differential output signal Voutp, Voutn. The differential input signal Vinp, Vinn includes two complementary input signals Vinp and Vinn that are input from a circuit outside the variable gain amplifier 1. A magnitude (amplitude) of the differential input signal Vinp, Vinn is equal to a difference Vinp−Vinn between the two input signals. The input signal Vinp is also referred to as a positive phase component of the differential input signal Vinp, Vinn, whereas the input signal Vinn is also referred to as a negative phase component of the differential input signal Vinp, Vinn. In that case, the positive phase component Vinp and the negative phase signal Vinn have opposite phases. That is, when the positive phase component Vinp increases, the negative phase component Vinn decreases, and conversely, when the positive phase component Vinp decreases, the negative phase component Vinn increases. Further, when the positive phase component Vinp reaches a maximum value (peak value), the negative phase component Vinn reaches a minimum value (bottom value). Conversely, when the positive phase component Vinp reaches a minimum value (bottom value), the negative phase component Vinn reaches a maximum value (peak value). The differential output signal Voutp, Voutn is a signal obtained by differentially amplifying the differential input signal Vinp, Vinn, and includes two complementary output signals Voutp and Voutn. The output signal Voutp is also referred to as a positive phase component of the differential output signal Voutp, Voutn, whereas the output signal Voutn is also referred to as a negative phase component of the differential output signal Voutp, Voutn. In this case, the output signal Voutp and the output signal Voutn have opposite phases. That is, when the positive phase component Voutp increases, the negative phase component Voutn decreases, and conversely, when the positive phase component Voutp decreases, the negative phase component Voutn increases. Further, when the positive phase component Voutp reaches a maximum value (peak value), the negative phase component Voutn reaches a minimum value (bottom value). Conversely, when the positive phase component Voutp reaches a minimum value (bottom value), the negative phase component Voutn reaches a maximum value (peak value). The amplitude of the differential output signal Voutp, Voutn is equal to a difference Voutp−Voutn of the two output signals. The variable gain amplifier 1 includes an amplifying circuit 100, a gain control circuit 150, and a current control circuit 200.

The amplifying circuit 100 is a circuit that amplifies the differential input signal Vinp, Vinn with a gain set by a gain control signal. The gain control signal is a signal that is generated by the gain control circuit 150 to be described below, and is a control signal for controlling an output amplitude of the amplifying circuit 100 to be close to a desired value. The output amplitude of the amplifying circuit 100 is, for example, an amplitude Voutp−Voutn of the differential output signal Voutp, Voutn. In this case, the gain control signal is a control signal for causing the amplitude value (for example, peak-to-peak value) of the differential output signal Voutp, Voutn with respect to the amplitude value (for example, peak-to-peak value) of the differential input signal Vinp, Vinn to be close to a target value. The gain control signal is a signal for generating a potential difference $\Delta V$ between a base of a transistor Q3 and a base of a transistor Q4 and between a base of a transistor Q5 and a base of a transistor Q6, which will be described below. Hereinafter, the gain control signal is referred to as a gain control signal $\Delta V$. The amplifying circuit 100 is provided between a power supply line 50 and a ground (ground line), and operates by electric power that is supplied through the power supply line 50. The power supply line 50 is electrically connected to an external power supply. The voltage of the power supply line 50 is substantially equal to a power supply voltage that is supplied by the power supply. Specifically, the amplifying circuit 100 includes a current source 5 (a first current source), a differential circuit 10 (a first differential circuit), a differential circuit 20 (a second differential circuit), and a differential circuit 30 (a third differential circuit).

The current source 5 is connected between the differential circuit 10 and the ground (or the ground line connected to the ground). The current source 5 has two terminals, a first end and a second end. The first end is electrically connected to the differential circuit 10 and the second end is electrically connected to the ground. The current source 5 is provided so that a direct current Ia (source current) flows from the differential circuit 10 (or the first end) toward the ground (or the second end). The direct current Ia can be controlled by the current control circuit 200 to be described below. A circuit configuration of the current source 5 is not particularly limited, and various known circuit configurations may be used.

The differential circuit 10 is a first differential circuit including a transistor Q1, a transistor Q2, a terminal 5a (a first constant current terminal), a resistor 7 (a third resistor), a resistor 8 (a fourth resistor), a terminal 11 (a first output terminal), and a terminal 12 (a second output terminal).

The transistor Q1 and the transistor Q2 constitutes a pair of differential transistors (a differential pair). For example, the transistors Q1 and Q2 are designed to have the same configuration and the same electrical characteristics. The input signal Vinp which is a positive phase component of the differential input signal is input to the base of the transistor Q1, and the input signal Vinn that is a negative phase component of the differential input signal is input to the transistor Q2. When a logical value of the input signal is inverted, the input signal Vinn that is a negative phase component of the differential input signal Vinp, Vinn may be input to the base of the transistor Q1, and the input signal Vinp that is a positive phase component of the differential input signal Vinp, Vinn may be input to the transistor Q2. Such an exchange of electric wiring causes inversion of a logic value of a differential signal. The amplifying circuit 100 performs noninverting amplification in which a logical value of the differential output signal Voutp, Voutn becomes the high level (Voutp is a peak value and Voutn is a bottom value) and the logical value of the differential input signal directly becomes the logical value of the differential output signal, for example, when a logical value of the differential input signal Vinp, Vinn is at a high level (a state in which Vinp is the peak value and the Vinn is the bottom value). On the other hand, the amplifying circuit 100 can perform inverting amplification in which, when Vinp and Vinn of the input signals are exchanged with each other, for example, a logical value of the differential output signal Voutp, Voutn is at a low level (a state in which Voutp has a bottom value and Voutn has a peak value) when a logical value of the differential input signal Vinp, Vinn is at a high level, and a logical value of the differential input signal is inverted and becomes a logical value of the differential output signal.

The terminal 5a is electrically connected to the current source 5 described above. "Terminal" as used herein means a node in a circuit configuration, and is, for example, a connection point of a plurality of circuit elements or a connection point of electric wires for connecting the plurality of circuit elements, and does not mean that a component for electrically connecting with an external circuit at a position of the terminal (for example, an electrode, a pad, or a pin) is prepared. The terminal 5a is electrically connected to one end (the first end) of the current source 5. The ground (ground line) is electrically connected to the other end (the second end) of the current source 5. The resistor 7 is connected between an emitter of the transistor Q1 and the terminal 5a. The resistor 8 is connected between the emitter of the transistor Q2 and the terminal 5a. Resistance values of the resistor 7 and the resistor 8 are set to the same value (a specified value). Therefore, the emitter of the transistor Q1 and the emitter of the transistor Q2 are connected to each other via a series circuit of the resistor 7 and the resistor 8. The terminal 5a is provided between the resistor 7 and the resistor 8.

The terminal 11 is electrically connected to a collector of the transistor Q1. A current flowing through the terminal 11 (a collector of the transistor Q1) is referred to and illustrated as a current $I_1$. The terminal 11 may be the collector of the transistor Q1. The terminal 12 is electrically connected to a collector of the transistor Q2. A current flowing through the terminal 12 (a collector current of the transistor Q2) is referred to and illustrated as a current $I_2$. The terminal 12 may be the collector of the transistor Q2.

The differential circuit 10 having the configuration described above splits the direct current Ia flowing from the terminal 5a to the current source 5 into the current $I_1$ flowing through the terminal 11 and the current $I_2$ flowing through the terminal 12 according to the differential input signal Vinp, Vinn. That is, when a potential of the positive phase component Vinp is higher than a potential of the negative phase component Vinn, the current $I_1$ becomes larger than the current $I_2$, and on the other hand, when the potential of the positive phase component Vinp is lower than the potential of the negative phase component Vinn, the current $I_1$ becomes smaller than the current $I_2$. A sum $I_1+I_2$ of the current $I_1$ and the current $I_2$ is equal to the direct current Ia. That is, since $I_1+I_2$ has a constant value, but the splitting of current $I_1$ and the current $I_2$ is determined according to the input signals Vinp, Vinn, the currents $I_1$ and $I_2$ become signals that vary with time. Here, respective base currents flowing into the bases of the transistors Q1 and Q2 are smaller than the collector currents $I_1$ and $I_2$ and can be considered negligible.

The differential circuit 20 includes a transistor Q3, a transistor Q4, a terminal 22 (a second constant current terminal), a terminal 23 (a third output terminal), a terminal 24 (a fourth output terminal), and a resistor 41 (a first resistor).

The transistors Q3 and Q4 constitutes a pair of differential transistors (a differential pair). The transistors Q3 and Q4, for example, are designed to have the same configuration and the same electrical characteristics. A gain control signal ΔV is input to a base of the transistor Q3 and a base of the transistor Q4.

The terminal 22 is electrically connected to an emitter of the transistor Q3 and an emitter of the transistor Q4. The terminal 22 is connected to the terminal 11 of the differential circuit 10. Therefore, similarly to the terminal 11, the current $I_1$ also flows through the terminal 22. The terminal 22 may be an emitter of the transistor Q3 or an emitter of the transistor Q4, or may be a portion (an intermediate point therebetween) in which the emitter of the transistor Q3 is electrically connected to the emitter of the transistor Q4.

The terminal 23 is electrically connected to a collector of the transistor Q3. A current flowing through the terminal 23 (a collector current of the transistor Q3) is referred to and illustrated as a current $I_3$. The terminal 23 is directly connected to the power supply line 50. The direct connection means that the terminal 23 and the power supply line 50 are connected to each other without passing through an element such as a resistor (without passing through a significant resistance component). The terminal 23 may be the collector of the transistor Q3.

The terminal 24 is electrically connected to a collector of the transistor Q4. A current flowing through the terminal 24 (a collector current of the transistor Q4) is referred to and illustrated as a current $I_4$. The terminal 24 is connected to the power supply line 50 via the resistor 41. The resistor 41 is connected between the terminal 24 and the power supply line 50. The terminal 24 may be the collector of the transistor Q4.

The differential circuit 20 having the configuration described above splits the current $I_1$ flowing through the terminal 22 into the current $I_3$ flowing through the terminal 23 and the current $I_4$ flowing through the terminal 24 according to the gain control signal ΔV.

The differential circuit 30 includes a transistor Q5, a transistor Q6, a terminal 33 (a third constant current terminal), a terminal 35 (a fifth output terminal), a terminal 36 (a sixth output terminal), and a resistor 42 (a second resistor).

The transistors Q5 and Q6 constitutes a pair of differential transistors. The transistor Q5 and the transistor Q6, for example, are designed to have the same configuration and the same electrical characteristics. In the embodiment of the present invention, the transistors Q3 to Q6 are designed, for example, to have the same configuration and the same electrical characteristics. Similar to the base of the transistor Q3 and the base of the transistor Q4, the gain control signal ΔV is input to a base of the transistor Q5 and a base of the transistor Q6. One of two signals constituting the gain control signal ΔV is input to the transistor Q4 and the transistor Q5, and the other is input to the transistor Q3 and the transistor Q6. One of the two signals constituting the gain control signal ΔV has a potential difference ΔV with the other.

The terminal 33 is connected to an emitter of the transistor Q5 and an emitter of the transistor Q6. The terminal 12 of the differential circuit 10 is connected to the terminal 33. Therefore, similar to the terminal 12, the current $I_2$ also flows through the terminal 33. The terminal 33 may be the emitter of the transistor Q5 or the emitter of the transistor Q6 or may be a portion (an intermediate point therebetween) in which the emitter of the transistor Q5 is electrically connected to the emitter of the transistor Q6.

The terminal 35 is electrically connected to a collector of the transistor Q5. A current flowing through the terminal 35 (a collector current of the transistor Q5) is referred to and illustrated as a current $I_5$. The terminal 35 is connected to the power supply line 50 via the resistor 42. The terminal 35 may be the collector of the transistor Q5.

The terminal 36 is electrically connected to a collector of the transistor Q6. A current flowing through the terminal 36 (a collector current of the transistor Q6) is referred to and illustrated as a current $I_6$. The terminal 36 is directly connected to the power supply line 50. The direct connection means that the terminal 36 and the power supply line 50 are connected to each other without passing through an element such as a resistor (without passing through a significant resistance component). The terminal 36 may be the collector of the transistor Q6.

The resistor 42 is connected between the terminal 35 and the power supply line 50. A resistance value of the resistor 42 is set to the same value as the resistance value of the resistor 41.

The differential circuit 30 having the above-described configuration splits the current $I_2$ flowing through the terminal 33 into a current $I_5$ flowing through the terminal 35 and a current $I_6$ flowing through the terminal 36 according to the gain control signal ΔV.

Here, since the transistors Q3 to Q6 have the same configuration and the same electric characteristics and the resistance value of the resistor 41 is equal to the resistance value of the resistor 42 as described above, a ratio of the current $I_4$ to the current $I_3$ in the differential circuit 20 is maintained equal to a ratio of the current $I_5$ to the current $I_6$ in the differential circuit 30 according to a value of the gain control signal ΔV. Configuring the differential circuit 20 and the differential circuit 30 as described above allows the amplifying circuit 100 to output the differential output signal Voutp, Voutn from the terminal 24 of the differential circuit 20 and the terminal 35 of the differential circuit 30. That is, the amplifying circuit 100 outputs the differential output signal Voutp, Voutn. The voltages of the output signals Voutp and Voutn are output with reference to a voltage value (supply voltage value) of the power supply line 50. For example, when the current $I_5$ is zero, the voltage of the output signal Voutp becomes equal to the supply voltage value and corresponds to the peak value. When the current $I_5$ is equal to the direct current Ia, the voltage of the output signal Voutp is a value lower than the power supply voltage value by voltage drop of the resistor 42 (equal to a product of the resistance value of the resistor 42 and the current value of the direct current Ia) and corresponds to the bottom value. Further, when the current $I_4$ is zero, the voltage of the output signal Voutn becomes equal to the power supply voltage value and corresponds to the peak value. When the current $I_4$ is equal to the direct current Ia, the voltage of the output signal Voutn is a value lower than the power supply voltage value by a voltage drop of the resistor 41 (equal to a product of the resistance value of the resistor 41 and the current value of the direct current Ia), and corresponds to the bottom value. When the gain control signal $\Delta V$ is changed, the respective peak values of the output signals Voutp and Voutn do not change, but the respective bottom values change as the currents $I_5$ and $I_4$ change according to the gain control signal $\Delta V$. When a duty ratio of the differential input signal is 50% and a mark ratio is 50%, an average output potential of the output signals Voutp and Voutn becomes equal to an average value of the respective peak values and the respective bottom values. Therefore, when the gain control signal $\Delta V$ is changed, change of the bottom value of the output signals Voutp and Voutn causes change of the average output potential.

The gain control circuit 150 supplies the gain control signal $\Delta V$ to the differential circuit 20 and the differential circuit 30 to control a gain of the amplifying circuit 100. The gain control circuit 150 detects the amplitude of the differential output signal Voutp, Voutn and performs a feedback control of the gain control signal $\Delta V$ based at least in part on a result of the detection. The gain control circuit 150 includes an amplitude detection circuit 151 and a control circuit 152. The amplitude detection circuit 151 detects the amplitude of the differential output signal Voutp, Voutn. The control circuit 152 adjusts the gain control signal $\Delta V$ based at least in part on a result of the detection of the amplitude detection circuit 151 so that the amplitude of the differential output signal Voutp, Voutn becomes a desired value. A specific circuit configuration or the like of the gain control circuit 150 including the amplitude detection circuit 151 and the control circuit 152 is not particularly limited, but may be the same as a circuit configuration of Japanese Unexamined Patent Publication No. 2011-205470, for example.

Here, the amplitude of the differential input signal Vinp, Vinn input from the outside is not constant but variable in a specified range. In this case, it should be noted that the gain control signal $\Delta V$ generated by the gain control circuit 150 can be changed from moment to moment according to the variation of the differential input signal Vinp, Vinn so that the amplitude of the differential output signal Voutp, Voutn becomes a desired value (constant value) even when the amplitude of the differential input signal Vinp, Vinn varies. For example, when the amplitude of the differential input signal Vinp, Vinn is decreased, the gain (differential gain) of the differential amplifying circuit 100 is increased and compensation is performed so that the amplitude of the differential output signal Voutp, Voutn does not fall from the desired value. Further, when the amplitude of the differential input signal Vinp, Vinn is increased, the gain (differential gain) of the differential amplifying circuit 100 is decreased and compensation is performed so that the amplitude of the differential output signal Voutp, Voutn does not rise from the desired value.

The current control circuit 200 adjusts the source current flowing through the amplifying circuit 100. Specifically, the current control circuit 200 adjusts the source current flowing through the amplifying circuit 100 by adjusting the magnitude of the direct current Ia flowing through the current source 5 according to the gain control signal $\Delta V$. The current control circuit 200 includes a control circuit 210 and a memory circuit 220 as functional blocks. The control circuit 210 is a circuit that executes various processes necessary for adjusting the current Ia flowing through the current source 5 according to the gain control signal $\Delta V$. The memory circuit 220 is a unit that stores various pieces of information necessary for the processes that are executed by the control circuit 210. A specific configuration for realizing functions of the control circuit 210 and the memory circuit 220 is not particularly limited. For example, the functions of the control circuit 210 and the memory circuit 220 may be realized by a microcontroller and peripheral circuits thereof (for example, a comparator and a driver circuit), or the functions of the control circuit 210 and the memory circuit 220 may be realized by, for example, a circuit for a specific use.

The control circuit 210 performs a process of detecting the amplitude of the gain control signal $\Delta V$ (an amplitude detection process). This process is performed, for example, by monitoring voltages of a pair of signal lines transferring the gain control signal $\Delta V$ output from the gain control circuit 150. More specifically, a potential difference between the paired signal lines may be detected by, for example, an operational amplifier circuit having an input impedance of tens of $K\Omega$ to tens of $M\Omega$ which is higher than input impedance of the differential transistors Q3 to Q6. Further, the control circuit 210 performs a process of adjusting the direct current Ia flowing through the current source 5 (a control process). This process can be performed, for example, by controlling a component (a switch element, a variable resistance element, or the like) for changing the direct current Ia in the current source 5.

The memory circuit 220 stores a look-up table referred to when the control circuit 210 performs the process of adjusting the direct current Ia described above. This look-up table stores information in which the gain control signal $\Delta V$ is associated with the current value of the direct current Ia flowing through the current source 5.

In an embodiment of the present invention, the look-up table is referenced by the control circuit 210 in order to determine the magnitude of the appropriate direct current Ia according to the gain control signal $\Delta V$. The magnitude of the appropriate direct current Ia is a current value of the direct current Ia capable of suppressing variation of the average output potential, improving power efficiency over a wide range of the amplitude of the differential input signal, and suppressing deterioration of a distortion rate in the differential amplifying circuit 100. Such a look-up table is created based at least in part on the following findings.

First, in the variable gain amplifier 1 illustrated in FIG. 1, when the gain of the amplifying circuit 100, that is, the gain control signal $\Delta V$, changes, the DC output potential (average output potential) of the differential output signal Voutp, Voutn changes, as described above. Further, the average output potential with respect to a reference potential (the potential of the power supply line 50) is proportional to the direct current Ia that is supplied by the current source 5. This can also be understood, for example, from the fact that the current $I_5$ flowing through the transistor Q5 is expressed as $I_5 = f(\Delta V, T) \times (I_{dc}/2) - f(\Delta V, T) \times (i_{ac}/2)$. Here, f represents a function. T is a temperature relating to the variable gain amplifier 1 (for example, an environmental temperature, an ambient temperature, or a junction temperature of a transistor). $I_{dc}$ is equal to the direct current Ia (source current) flowing through the current source 5. $i_{ac}$ is an AC component value flowing through the current source 5. The DC output potential is determined by a term of a DC component value $I_{dc}$ in the above equation. The gain of the amplifying circuit 100 and the amplitudes (output amplitudes) of the differential output signal Voutp, Voutn are determined by a term $i_{ac}$ in the above equation. Since the average output potential is proportional to the magnitude of the direct current Ia, it is preferable to reduce variation of the current Ia to be as small as possible in order to suppress variation of the average output potential. A magnitude of a current $i_{ac}$ is set to be equal to or smaller than the magnitude of the direct current Ia.

Further, in the variable gain amplifier 1, a maximum input voltage capable of stabilizing the linearity (that is, low distortion rate) of the amplifying circuit 100, that is, the amplitude (input amplitude) of the differential input signal Vinp, Vinn, depends on the direct current Ia flowing through the current source 5 and a resistance value of the resistor 7 and the resistor 8. More specifically, when the voltage that can stabilize the linearity of the amplification operation in the amplifying circuit 100 is a maximum input voltage $V_{inlim}$, $V_{inlim}=(I_{dc}/2)\times RE$. Here, RE is a resistance value of the resistor 7 and the resistor 8. In this case, in order to stabilize the linearity of the amplifying circuit 100 even when the differential input signal Vinp, Vinn is large, it is necessary to increase the direct current Ia or increase the resistance value of the resistor 7 and the resistor 8 in order to increase the maximum input voltage $V_{inlim}$. However, when a resistance value of the resistor 7 and the resistor 8 increases, the gain of the amplifying circuit 100 is reduced. This is because a maximum gain $Gain_{max}$ of the amplifying circuit 100 is expressed as $Gain_{max}=RL/RE$. Here, RL is a resistance value of the resistor 41 and the resistor 42. Therefore, it is preferable to stabilize the linearity of the amplifying circuit 100 by increasing the direct current Ia with respect to the large differential input signal Vinp, Vinn. However, when the direct current Ia is too large, only a portion of the direct current Ia contributes to the amplification operation when the amplitude of the differential input signal Vinp, Vinn is small, and therefore the power efficiency decreases.

On the basis of the above, a scheme for determining the direct current Ia capable of suppressing variation of the average output potential of the differential output signal, improving the power efficiency and suppressing deterioration of a distortion rate over a wide input range of the amplitude of the differential input signal will be described.

Figure 2:
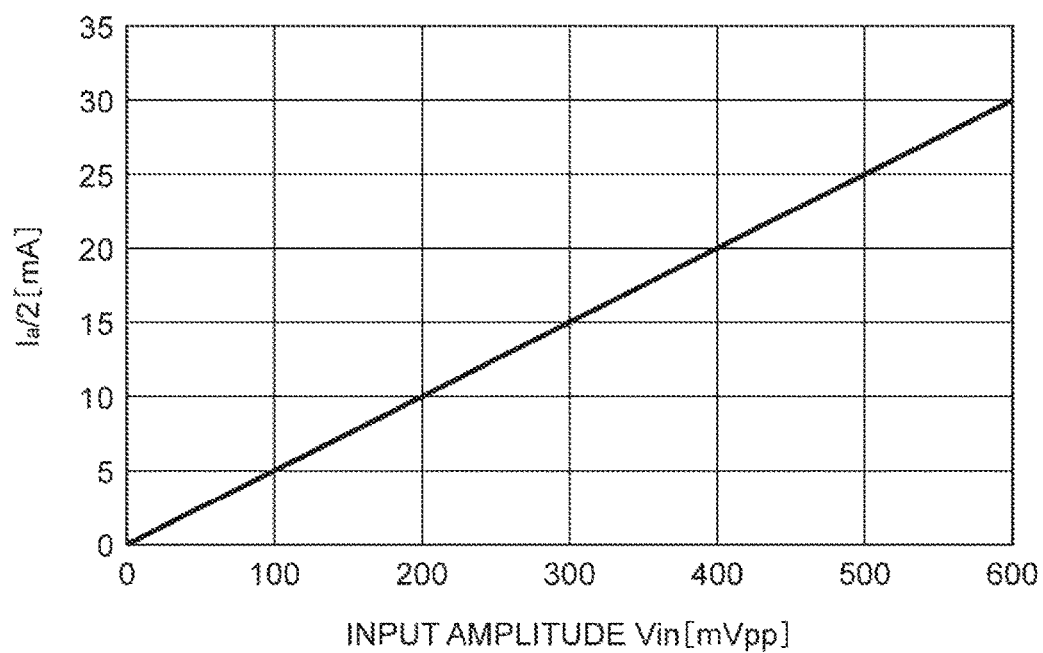
FIG. 2 is a diagram illustrating an example of a value of a source current necessary for stabilizing linearity of an amplifier with respect to an input amplitude.

First, an example of a scheme for obtaining a relationship between the amplitude (input amplitude) of the differential input signal Vinp, Vinn and the direct current Ia necessary for stabilizing the linearity of the amplifying circuit 100 when the differential input signal Vinp, Vinn having the amplitude is input to the amplifying circuit 100 will be described. As illustrated in FIG. 2, as the amplitude value of the differential input signal Vinp, Vinn (hereinafter also referred to as an "input amplitude Vin"; in this case, for example, Vin=Vinp-Vinn) increases, the direct current Ia necessary for stabilizing the linearity of the amplifying circuit 100 increases. In the graph illustrated in FIG. 2, a horizontal axis represents the input amplitude Vin and a vertical axis represents a value (Ia/2) which is one half of the direct current Ia (source current) necessary for stabilizing the linearity of the amplifying circuit 100. In this graph, the direct current Ia is obtained from Ia/2=Vin/(RE-x). Here, x is a constant that is subtracted from RE in order to cause the current Ia to be larger than a theoretical value $2\times(Vin/RE)$ that is obtained from Ohm's law and to have a margin. According to the direct current Ia obtained in this way, since a maximum input voltage $V_{inlim}$ that can stabilize the linearity is $V_{inlim}=Vin/(1-x/RE)$, $V_{inlim}$ is always greater than the input amplitude Vin, and the linearity of the amplifying circuit 100 is guarded.

According to the graph illustrated in FIG. 2, when some input amplitude Vin is given, the direct current Ia necessary for stabilizing the linearity of the amplifying circuit 100 is obtained. Therefore, the linearity of the amplifying circuit 100 can be secured by adjusting such a direct current Ia to flow through the current source 5. In this case, as one method, directly detecting the input amplitude Vin, that is, the amplitude of the differential input signal Vinp, Vinn, can be considered. However, when a detection circuit for detecting the differential input signal Vinp, Vinn is connected to the input terminal (the base terminals of the transistors Q1 and Q2) of the amplifying circuit 100, a waveform of the differential input signal deteriorates due to an influence of input impedance of the detection circuit. Further, as improvement of the method, preventing the influence on the differential input signal Vinp, Vinn by connecting a detection circuit via a filter circuit having a high input impedance can be considered, but it is difficult to provide an appropriate filter circuit since a fundamental frequency of the differential input signal Vinp, Vinn is very high (for example, 25 GHz). Therefore, in the present embodiment, a method fundamentally different from such methods is used. That is, the gain control signal ΔV is detected, and the direct current Ia is adjusted based at least in part on a result of the detection, instead of directly detecting the amplitude of the differential input signal Vinp, Vinn which is a high-frequency signal.

Figure 3:
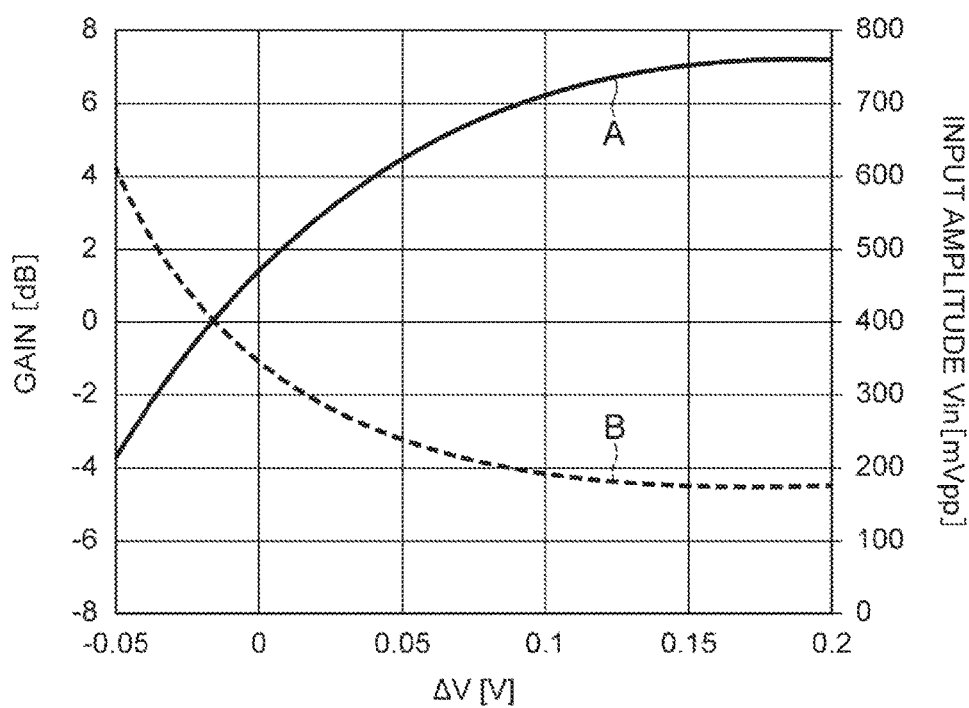
FIG. 3 is a diagram illustrating an example of a relationship between a gain control signal AV and a gain or an input amplitude of an amplifier.

For example, the input amplitude Vin can be obtained on the basis of the gain control signal ΔV from a graph illustrated in FIG. 3. In the graph of FIG. 3, a horizontal axis represents the gain control signal ΔV, a left vertical axis represents the gain (differential voltage gain) of the amplifying circuit 100, and a right vertical axis represents the input amplitude Vin. In the graph, a curve A corresponds to the gain of amplifying circuit 100, and a curve B corresponds to the input amplitude Vin. As described above, the gain control signal ΔV is generated by the gain control circuit 150 so that the amplitude value (hereinafter also referred to as an "output amplitude Vout". In this case, for example, Vout=Voutp-Voutn) of the differential output signal Voutp, Voutn is constant. Under such feedback control, the value of the gain (Vout/Vin) for setting the output amplitude Vout to a predetermined value is determined with respect to a certain input amplitude Vin. The gain control signal ΔV necessary for obtaining the gain is uniquely determined. When the gain control signal ΔV is determined, the gain of the amplifying circuit 100 is uniquely determined accordingly. In this example, as shown by the curve A, the gain of the amplifying circuit 100 nonlinearly changes according to the gain control signal ΔV. Under the feedback control of maintaining the amplitude of the differential output signal Voutp, Voutn to be constant, the input amplitude Vin is uniquely determined when the gain of the amplifying circuit 100 is determined. Therefore, since the input amplitude Vin is uniquely determined, the current value of the direct current Ia necessary for stabilizing the linearity of the amplifying circuit 100 is also uniquely determined, as described above with reference to FIG. 2. Accordingly, when the gain control signal ΔV is detected without directly detecting the input amplitude Vin, the direct current Ia necessary for stabilizing the linearity of the amplifying circuit 100 can be recognized therefrom. With the current control circuit 200, it is possible to adjust such a direct current Ia to flow through the current source 5.

In summary, when some gain control signal ΔV is given, the input amplitude Vin corresponding thereto can be known from the graph illustrated in FIG. 3. As described above with reference to FIG. 2, the direct current Ia necessary for stabilizing the linearity of the amplifying circuit 100 is determined from the input amplitude Vin, the resistance value RE of the resistors 7 and 8, or the like. Therefore, it is possible to associate the gain control signal ΔV with the direct current Ia necessary for stabilizing the linearity of the amplifying circuit 100. A look-up table in which such association has been set is stored in the memory circuit 220. The look-up table may be set based at least in part on design data of the variable gain amplifier 1 or may be set based at least in part on experiment data (measurement data) obtained in advance. For example, in order to suppress a variation in manufacture of the variable gain amplifier 1 in mass production, the relationship of FIG. 3 may be obtained for each variable gain amplifier 1 and the look-up table may be individually set.

Figure 4:
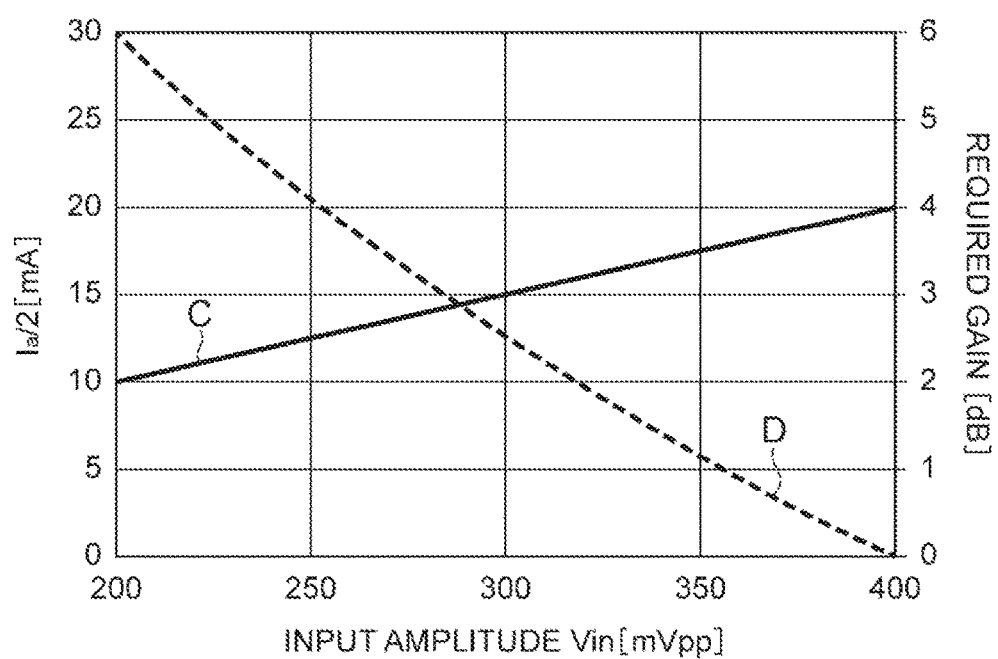
FIG. 4 is a diagram illustrating an example of a source current controlled according to the input amplitude.

Next, advantages of the variable gain amplifier 1 according to the embodiment of the present invention will be described with reference to FIGS. 4 to 6. The advantages described herein are results of analysis when it is assumed that a resistance value RE of the resistor 7 and the resistor 8 is 25Ω, a resistance values RL of the resistor 41 and the resistor 42 is 150Ω, and the input amplitude Vin is 200 to 400 mV. A half value (Ia/2) of a current value of the direct current Ia corresponding to the input amplitude Vin is 10 to 20 mA. FIG. 4 illustrates a relationship between the input amplitude Vin, the current value (Ia/2), and the gain to be set (required gain) when a target value of the amplitude value of the differential output signal Voutp, Voutn is set to 400 mV under such conditions. An amplitude value of 2 to 4 V is required as a drive signal of the optical modulator. Here, the target value of the amplitude value of the differential output signal Voutp, Voutn is set to 400 mV because a configuration in which a differential amplifier having a fixed gain of 14 dB to 20 dB (5 to 10 times) is inserted between the variable gain amplifier 1 and the optical modulator is assumed. The variable gain amplifier 1 may be configured to directly drive the optical modulator without using such a differential amplifier. The required gain is a gain of the amplifying circuit 100 necessary for the amplitude value of the differential output signal Voutp, Voutn to reach the target value. For example, when the amplitude value Vin of the differential input signal Vinp, Vinn is large, the required gain decreases, and when the amplitude value Vin of the differential input signal Vinp, Vinn is small, the required gain increases. In the graph, a curve C corresponds to the current value (Ia/2), and a curve D corresponds to the required gain. As shown by the curve C, the current value (Ia/2) also increases as the input amplitude Vin increases. Further, as shown by the curve D, the required gain decreases as the input amplitude Vin increases. In this example, the required gain varies between 0 dB to 6 dB, and when the input amplitude Vin is 400 mV, the required gain is 0 dB. As described above, in the variable gain amplifier 1 according to the present embodiment, the control circuit 210 of the current control circuit 200 can receive the gain control signal ΔV and adjust the direct current Ia flowing through the current source 5 according to the input amplitude Vin. Therefore, it is possible to perform the control of the direct current Ia to satisfy the relationship between the input amplitude Vin and the current value (Ia/2) as illustrated in FIG. 4 according to the gain control signal ΔV. A relationship between the gain and the direct current Ia is that the gain is increased when the input amplitude is small in the feedback control described above, and in this case, it is preferable for the direct current Ia to be set to a small value. Further, the gain is decreased when the input amplitude is large, and in this case, it is preferable for the direct current to be set to a large value. That is, when the gain is increased, the direct current Ia is decreased, and when the gain is decreased, the direct current Ia is increased. Next, an advantage of such control in the control circuit 210 will be described with reference to FIGS. 5 and 6.

Figure 5:
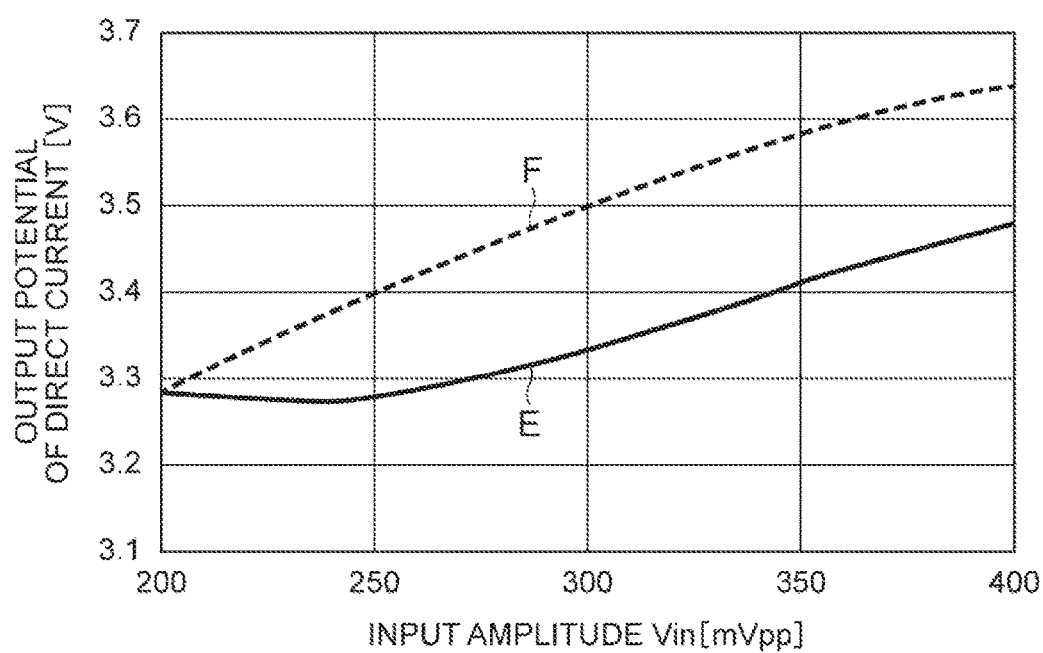
FIG. 5 is a diagram illustrating an example of an average output potential in which input amplitude dependence is suppressed.

First, according to the above-described control in the control circuit 210, it is possible to suppress the variation of the average output potential of the differential output signal Voutp, Voutn, as illustrated in FIG. 5. In the graph of FIG. 5, a horizontal axis represents the input amplitude Vin, and a vertical axis represents the average output potential of the differential output signal Voutp, Voutn. A curve E shows an example of the average output potential in the variable gain amplifier 1 according to the embodiment of the present invention. A curve F shows an example of the average output potential when the current value (Ia/2) is maintained to be constant at 10 mA as a comparative example. When the gain is halved (from 6 dB to 0 dB), that is, the input amplitude Vin increases from 200 mVpp to 400 mVpp as illustrated in FIG. 4 described above, the average output potential increases from 3.28 V to 3.63 V and fluctuation of about 350 mV occurs in the comparative example shown by the curve F in FIG. 5. On the other hand, in the example of the present embodiment shown by the curve E, the current value (Ia/2) is variable and, for example, the direct current Ia is adjusted according to the input amplitude Vin. Accordingly, when the input amplitude Vin increases from 200 mVpp to 300 mVpp, the variation of the average output potential is smaller than 60 mV. Further, even when the input amplitude Vin further increases to 400 mVpp, the variation of the average output potential is suppressed to 200 mV.

Here, when power efficiency is considered and when the voltage (supply voltage) of the power supply line 50 of the variable gain amplifier 1 is Vcc=5 V, power consumption Pd of the amplifying circuit 100 is calculated using an equation Pd=Vcc×Ia [mW]. For example, when the input amplitude Vin is 400 mVpp, Ia/2=20 mA from the graph of FIG. 4, and therefore, Pd=5 V×40 mA=200 mW. Further, when the input amplitude Vin is 200 mVpp, Ia/2=10 mA from the graph of FIG. 4, and therefore, Pd=5 V×20 mA=100 mW. When the current value (Ia/2) is maintained to be constant at 20 mA, Pd =200 mW even when the input amplitude is 200 mVpp or 400 mVpp, and the power consumption does not change. However, as described above, in the variable gain amplifier 1, when the input amplitude is 200 mVpp, Pd=100 mW, and the power consumption is a half of 200 mW. Therefore, since the direct current Ia of the amplifying circuit 100 increases or decreases according to the increase or decrease in the input amplitude Vin, the power efficiency can be improved since the amount not contributing to the amplification operation of the direct current Ia decreases even when the input amplitude Vin is small.

Figure 6:
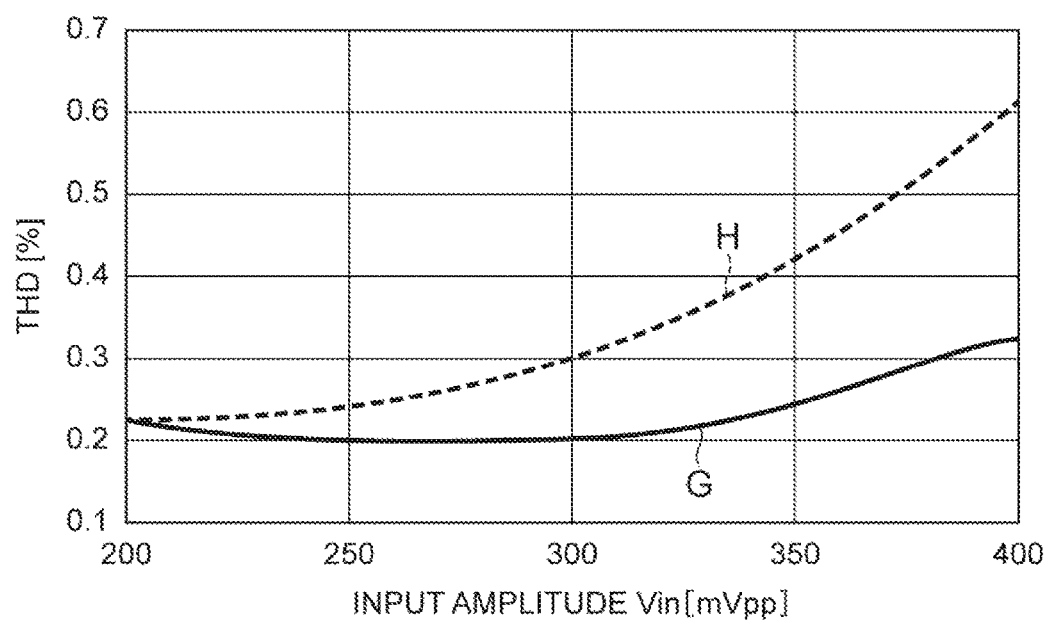
FIG. 6 is a diagram illustrating an example of a suppressed distortion rate.

Further, according to the above control in the control circuit 210, the linearity of the amplifying circuit 100 can be stabilized, as illustrated in FIG. 6. In FIG. 6, total harmonic distortion (THD) is used as an index indicating the linearity. Here, a fundamental frequency is 1 GHz, and a harmonic component is calculated up to a 13th-order term. Other conditions are as described above. In a graph of FIG. 6, a horizontal axis represents the input amplitude Vin, and a vertical axis represents the THD. When the input amplitude Vin increases, the THD tends to generally increase. A curve G shows an example of the THD in the variable gain amplifier 1 according to the present embodiment. A curve H shows an example of the THD when the current value (Ia/2) is maintained to be constant at 10 mA as a comparative example. In the example of the present embodiment shown by the curve E, the current value (Ia/2) is variable, and for example, since the current Ia is adjusted to a magnitude necessary for stabilizing the linearity of the amplifying circuit 100, an increase in the THD with respect to an increase in the input amplitude Vin is suppressed.

While the embodiments according to the present invention have been described above, the present invention is not limited to the above-described embodiments. That is, it can be easily understood by those skilled in the art that the present invention can be variously changed and modified within the spirit and scope of the appended claims.

What is claimed is:

1. A variable gain amplifier amplifying a differential input signal including a positive phase component and a negative phase component having phases opposite to each other with a gain according to a gain control signal, and outputting a differential output signal including a positive phase component and a negative phase component having phases opposite to each other, the variable gain amplifier comprising:
   an amplifying circuit including
      a first current source having a first end and a second end and supplying a source current flowing from the first end to the second end;
      a first differential circuit being electrically connected to the first end of the first current source and splitting the source current into a first current and a second current according to the differential input signal;
      a second differential circuit being electrically connected to the first differential circuit and splitting the first current into a third current and a fourth current according to a magnitude of the gain control signal;
      a third differential circuit being electrically connected to the first differential circuit, and splitting the second current into a fifth current and a sixth current according to the magnitude of the gain control signal so that a ratio of the fifth current to the sixth current is equal to a ratio of the fourth current to the third current;
      a first resistor being electrically connected to the second differential circuit and generating the negative phase component of the differential output signal according to a magnitude of a voltage drop occurring due to a flow of the fourth current; and
      a second resistor being electrically connected to the third differential circuit and generating the positive phase component of the differential output signal according to a magnitude of a voltage drop occurring due to a flow of the fifth current; and
   a current control circuit configure to control the first current source, decrease the source current when the gain control signal increases the gain, and increase the source current when the gain control signal decreases the gain.

2. The variable gain amplifier according to claim 1, wherein the first differential circuit includes:
   a third resistor connected to the first end of the first current source and being supplied with the first current, and
   a fourth resistor connected to the first end of the first current source and being supplied with the second current.

3. The variable gain amplifier according to claim 2, wherein the current control circuit adjusts the source current by referring to a look-up table in which the magnitude of the gain control signal is associated with a current value of the source current, and
   the current value of the look-up table is determined based at least in part on the magnitude of the gain control signal, a resistance value of the third resistor, and a resistance value of the fourth resistor.

4. The variable gain amplifier according to claim 2, wherein the first differential circuit further includes a first transistor electrically connected to the first end of the first current source through the third resistor, and a second transistor electrically connected to the first end of the first current source through the fourth resistor,
   the first transistor has a base that receives the positive phase component of the differential input signal, and a collector that generates the first current in accordance with the positive phase component of the differential input signal, and
   the second transistor has a base that receives the negative phase component of the differential input signal, and a collector that generates the second current in accordance with the negative phase component of the differential input signal.

5. The variable gain amplifier according to claim 4, wherein the second differential circuit includes:
   a third transistor having an emitter connected to the collector of the first transistor and a base receiving the gain control signal; and
   a fourth transistor having an emitter connected to the collector of the first transistor, a base receiving the gain control signal, and a collector, and
   the third differential circuit includes:
   a fifth transistor having an emitter connected to the collector of the second transistor, a base receiving the gain control signal, and a collector; and
   a sixth transistor having an emitter connected to the collector of the second transistor and a base receiving the gain control signal.

6. The variable gain amplifier according to claim 5, wherein the base of the third transistor is connected to the base of the sixth transistor, and
   the base of the fourth transistor is connected to the base of the fifth transistor.

7. The variable gain amplifier according to claim 5, further comprising:
   a power supply line,
   wherein the first resistor is electrically connected between the power supply line and the collector of the fourth transistor and generates the negative phase component of the differential output signal, and
   the second resistor is electrically connected between the power supply line and the collector of the fifth transistor and generates the positive phase component of the differential output signal.

8. The variable gain amplifier according to claim 1, further comprising:
   a gain control circuit configured to detect an amplitude of the differential output signal and generate the gain control signal for maintaining the amplitude of the differential output signal at a predetermined value.

9. The variable gain amplifier according to claim 8, wherein the gain control circuit includes:

an amplitude detection circuit configured to detect the amplitude of the differential output signal; and a control circuit configured to adjust the gain control signal so that the amplitude detected by the amplitude detection circuit has the predetermined value.

10. The variable gain amplifier according to claim 9, wherein the current control circuit adjusts the source current according to the gain control signal adjusted by the gain control circuit.

* * * * *